(12) United States Patent
Lee

(10) Patent No.: US 7,132,684 B2
(45) Date of Patent: Nov. 7, 2006

(54) TEST STRUCTURE FOR DETECTING DEFECT SIZE IN A SEMICONDUCTOR DEVICE AND TEST METHOD USING SAME

(75) Inventor: Jong-hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 147 days.

(21) Appl. No.: 10/834,071

(22) Filed: Apr. 29, 2004

(65) Prior Publication Data

US 2004/0262604 A1    Dec. 30, 2004

(30) Foreign Application Priority Data

Jun. 27, 2003    (KR) .................... 10-2003-0042793

(51) Int. Cl.
*H01L 23/58* (2006.01)
*H01L 29/10* (2006.01)

(52) U.S. Cl. .............................. 257/48; 257/E21.531
(58) Field of Classification Search ............... 257/48
See application file for complete search history.

(56) References Cited

U.S. PATENT DOCUMENTS

| | | | |
|---|---|---|---|
| 4,835,466 A * | 5/1989 | Maly et al. ............... 324/537 |
| 5,051,690 A | 9/1991 | Maly et al. | |
| 5,514,974 A * | 5/1996 | Bouldin ..................... 324/763 |
| 5,663,651 A * | 9/1997 | Hada ......................... 324/713 |
| 5,712,571 A * | 1/1998 | O'Donoghue ............... 324/539 |
| 5,900,735 A * | 5/1999 | Yamamoto .................. 324/537 |
| 6,111,269 A * | 8/2000 | Moyal ......................... 257/48 |
| 6,297,644 B1 | 10/2001 | Jarvis et al. | |
| 6,528,818 B1 * | 3/2003 | Satya et al. ................. 257/48 |
| 6,570,181 B1 * | 5/2003 | Graas et al. ................. 257/48 |
| 6,603,321 B1 * | 8/2003 | Filippi et al. ............... 324/719 |
| 6,787,802 B1 * | 9/2004 | Yokogawa ................... 257/48 |
| 2003/0034558 A1 * | 2/2003 | Umemura et al. ........... 257/734 |
| 2003/0218168 A1 * | 11/2003 | Okajima ...................... 257/48 |
| 2003/0237064 A1 * | 12/2003 | White et al. ................. 716/5 |

* cited by examiner

*Primary Examiner*—David A. Zarneke
(74) *Attorney, Agent, or Firm*—Volentine Francos & Whitt, PLLC

(57) ABSTRACT

A test structure and method for testing a semiconductor device are provided. The test structure including a first test pattern having a plurality of electrically separated metal patterns, a plurality of metal vias formed in opposite end portions of the respective metal patterns, and a second test pattern connected to the first test pattern through the metal vias. By using this structure, the presence, nature, and size of a metal failure can be detected by analyzing a resistance arising from the application of a test voltage to the first test pattern.

14 Claims, 4 Drawing Sheets

TEST STRUCTURE FOR DETECTING DEFECT SIZE IN A SEMICONDUCTOR DEVICE AND TEST METHOD USING SAME

BACKGROUND OF THE INVENTION

1. Field of the Invention

The present invention relates generally to a test structure and method for using the test structure during a semiconductor device manufacturing process. More particularly, the present invention relates to a test structure and related method for testing for metal failure in a semiconductor device. A claim of priority is made to Korean Patent Application No. 2003-42793, filed on Jun. 27, 2003, in the Korean Intellectual Property Office, the disclosure of which is incorporated by reference in its entirety.

2. Description of the Related Art

Multilevel metalization processes are used to form multi-layered metal patterns during the manufacture of a semiconductor device. Metal patterns are typically formed on a semiconductor substrate as well as the intermediate layers and components forming the semiconductor device. Indeed, metal patterns, as formed in the respective layers constituting a semiconductor device, are essential to the operation of the device. Thus, a metal failure, when occurring, is particularly troublesome. A metal failure occurs, for example, if a metal pattern is formed on a semiconductor substrate with an electrically shorted or open connection. Any number of problems in the complex manufacturing process required to produce a contemporary semiconductor device may be the cause of a metal failure. Nonetheless, manufacturing yield dramatically falls as the number of metal failures increases.

Conventionally, optical test (or inspection) equipment is used to check for manufacturing defects such as metal failures. Although such optical test equipment effectively detects manufacturing defects, it is incapable of distinguishing (or classifying) a particular defect amongst a broad range of possible defects. In particular, important defects directly resulting in a serious decline in manufacturing yield are not specifically identified by the conventional test equipment. Furthermore, the process of optically scanning for defects using conventional test equipment requires considerable time. Accordingly, it is generally impractical to inspect every portion of every semiconductor wafer during manufacture. Yet, if only selected portions of each semiconductor wafer, or portions of a selected batch sample are checked, many defects will go undetected and unsatisfactory yield will occur.

SUMMARY OF THE INVENTION

The test structure and related test method provided by the present invention allow a more throughout and accurate examination of a semiconductor device in relation to potential metal failures. Moreover, the present invention doesn't require the use of conventional optical test equipment. In addition to being much faster than the conventional, optical test methods, the test method provided by the present invention allows the nature and extent of a detected metal failure to be determination.

Thus, in one aspect, the present invention provides a test structure for use in the examination of a semiconductor device. The test structure comprises; a first test pattern including a plurality of electrically separated metal patterns, a plurality of metal vias formed proximate first and second end portions of each one of the plurality of metal patterns forming the first test pattern, and a second test pattern electrically connected to the first test pattern by the plurality of metal vias, Given this arrangement, a test voltage applied to the first test pattern will indicate a resistance that varies in accordance with the presence and nature of a metal failure. In a related aspect, the present invention provides a method of testing a semiconductor device using this test structure, wherein the method comprises; applying a test voltage to the first test pattern, and detecting the presence of a metal failure in relation to a resistance indicated upon application of the test voltage.

In this context, the test method normally returns a normal resistance value $R_{NOR}$ indicating the absence of a metal failure, where $R_{NOR}$ is defined by $\{N\times[(R_H+R_L)/(R_H R_L)]\}$, where N is the number of metal patterns, $R_H$ is the resistance of the second test pattern, and $R_L$ is equal to $[2R_{VIA}+R_{MP}]$, where $R_{VIA}$ is the resistance of the metal vias, and $R_{MP}$ is the resistance of a respective one of the metal patterns.

In contrast, the test method will return an open resistance value $R_{OP}$ indicating the presence of one or more open connections, where $R_{OP}$ is defined by $\{(N-X)\times[(R_H+R_L)/(R_H R_L)]+XR_H\}$, where N is the number of metal patterns, X is the number of open metal patterns, $R_H$ is the resistance of the second test pattern, and $R_L$ is equal to $[2R_{VIA}+R_{MP}]$, where $R_{VIA}$ is the resistance of the metal vias, and $R_{MP}$ is the resistance of a respective one of the metal patterns.

Further in contrast, the test method will return a short resistance value $R_{SH}$ indicating the presence of one or more shorted connections, where $R_{SH}$ is defined by $\{(N-X)\times[(R_H+R_L)/(R_H R_L)]+R_{MP}\}$, where N is the number of metal patterns, X is the number of shorted metal patterns, $R_H$ is the resistance of the second test pattern, and $R_L$ is equal to $[2R_{VIA}+R_{MP}]$, where $R_{VIA}$ is the resistance of the metal vias, and $R_{MP}$ is the resistance of a respective one of the metal patterns.

BRIEF DESCRIPTION OF THE DRAWINGS

The above and other features and advantages of the present invention will become readily apparent from the detailed description of several exemplary embodiments that follows with reference to the attached drawings in which.

DETAILED DESCRIPTION OF THE INVENTION

Figure 1:
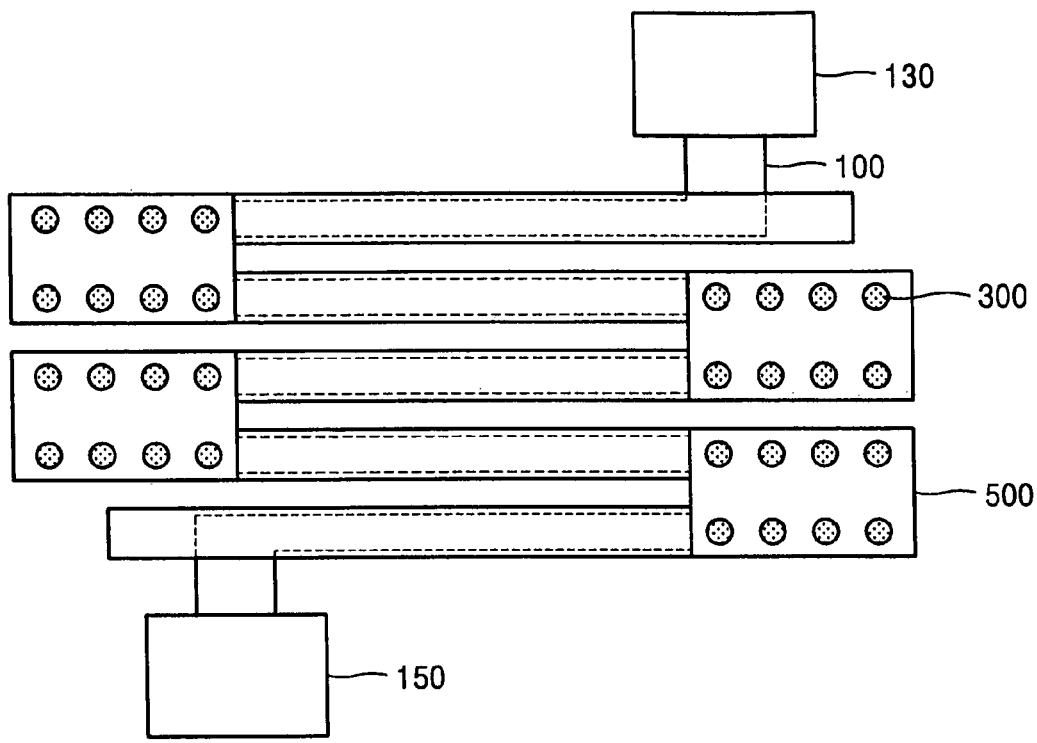
FIG. 1 is a layout depicting a test structure for a semiconductor device according to one embodiment of the present invention.

The present invention now will be described in further detail with reference to the attached drawings in which exemplary embodiments of the present invention are shown. Like reference numerals in FIGS. 1 through 8 are used to designate like elements common between two or more figures.

Figure 2:
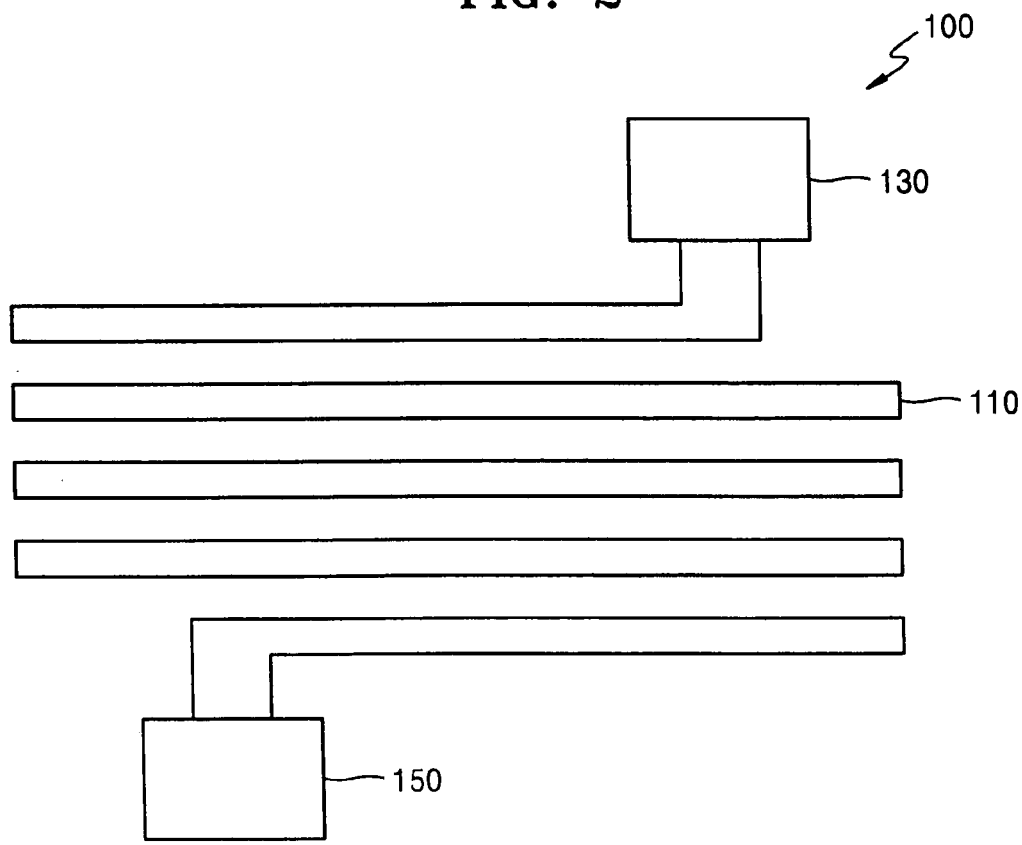
FIGS. 2 through 4 are layouts depicting a first test pattern, metal vias, and a second test pattern in relation to the example shown in FIG. 1.
Figure 3:
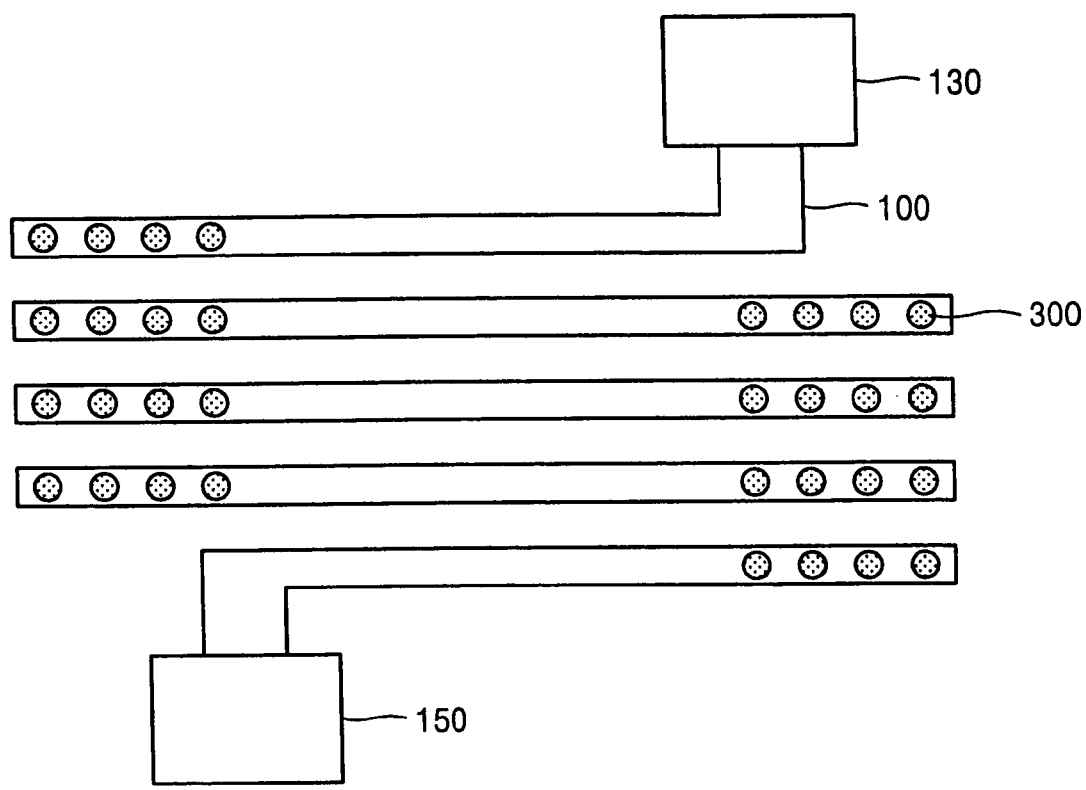
Figure 4:
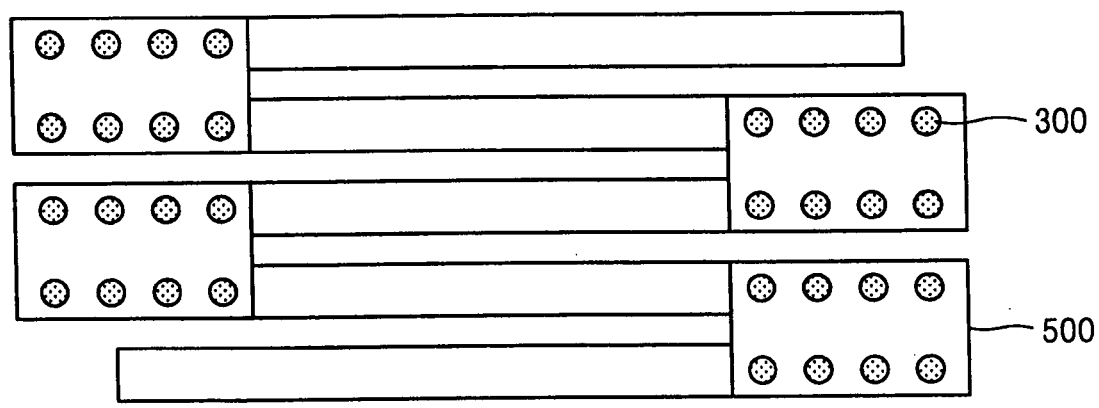
Figure 5:
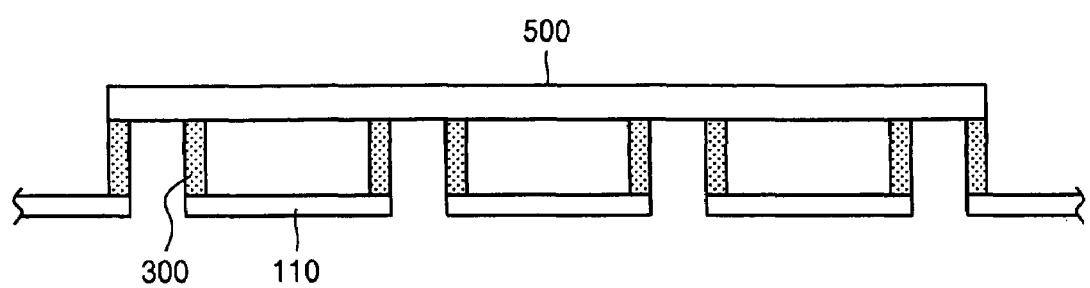
FIG. 5 is a cross-section of a test structure for a semiconductor device in relation to the example shown in FIG. 1.

FIG. 1 is a layout diagram of a test structure for a semiconductor device in accordance with one embodiment of the present invention. FIGS. 2 through 4 are similar layout diagram further illustrating a first test pattern, metal vias, and a second test pattern in relation to the exemplary test structure shown in FIG. 1. FIG. 5 is a cross-section of a test structure shown in FIG. 1.

As shown in FIG. 1, a test structure for the semiconductor device according to the present invention preferably includes a first test pattern 100, metal vias 300, and a second test pattern 500.

In the first test pattern 100, as illustrated in some additional detail in FIG. 2, a plurality of metal patterns 110 are formed physically detached and electrically separated one from another. In particular, both (first and second) end portions of the respective metal patterns 110 are not connected. For convenience, five metal patterns are illustrated in the working example. However, the number of metal patterns is a matter of routine design considerations. Metal patterns 110 forming the first test pattern 100 are preferably made of aluminum, copper, or an alloy of these materials. An input pad 130 capable of receiving an applied voltage is connected on one side of metal patterns 110. An output pad 150 capable of discharging and adapted to measure the applied voltage is connected to the other (opposite) side of metal patterns 110.

Metal vias 300, as illustrated in some additional detail in FIG. 3, are formed on both end portions of the unconnected metal patterns 110. These metal vias 300 are preferably formed from tungsten and connect first test pattern 100 with second test pattern 500.

As shown in FIG. 4, second test pattern 500 is formed on the metal vias 300 in order to electrically connect the metal vias 300. Second test pattern 500 is preferably made of tungsten, aluminium, copper or an alloy of these materials. Second test pattern 500 is also electrically connected to first test pattern 100 via metal vias 300. That is, electrical current that doesn't flow between end portions of the metal patterns 110 forming first test pattern 100 flows from input pad 130 to output pad 150 via the combination of metal vias 300 and second test pattern 500.

Within the test structure for the semiconductor device according to the present invention, an electrical current flows via the connection of metal patterns 110 forming first test pattern 100, metal vias 300, and second test pattern 500 when a test voltage is applied to input pad 130. In the absence of a metal failure, and upon application of a test voltage to input pad 130, the effect of a first resistance will generally be observed. However, where a metal failure (either an open or a short) is present in metal patterns 110, the effects of both a first and a second resistance can be observed because electrical current flows via the connection of first test pattern 100, metal vias 300, and second test pattern 500. Once this effect is observed, the type of metal failure, being either an open or a short connection, is determined by analysis of a difference measured between the first and second resistances. Furthermore, the present invention allows the shape and/or size of a metal failure to be detected. This is explained in more detail below.

Figure 6:
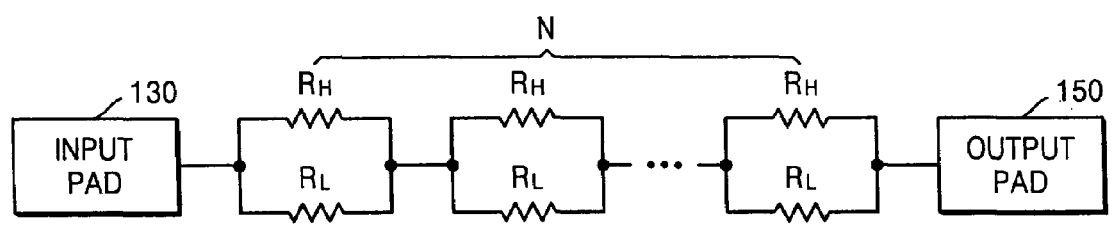
FIG. 6 is an equivalent circuit diagram for the test structure for a semiconductor device as shown in the example of FIG. 1, and illustrating a test method using this test structure.
Figure 7:
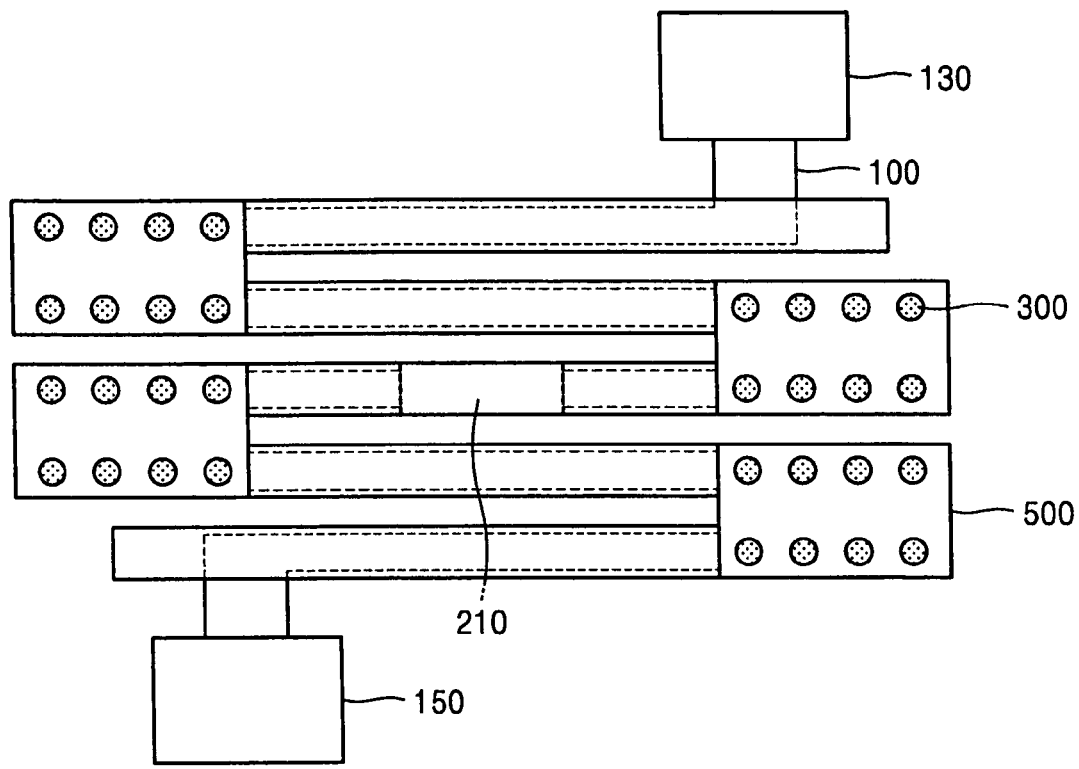
FIGS. 7 and 8 are drawings further illustrating a test method in relation to the test structure of a semiconductor device shown in the example of FIG. 1.
Figure 8:
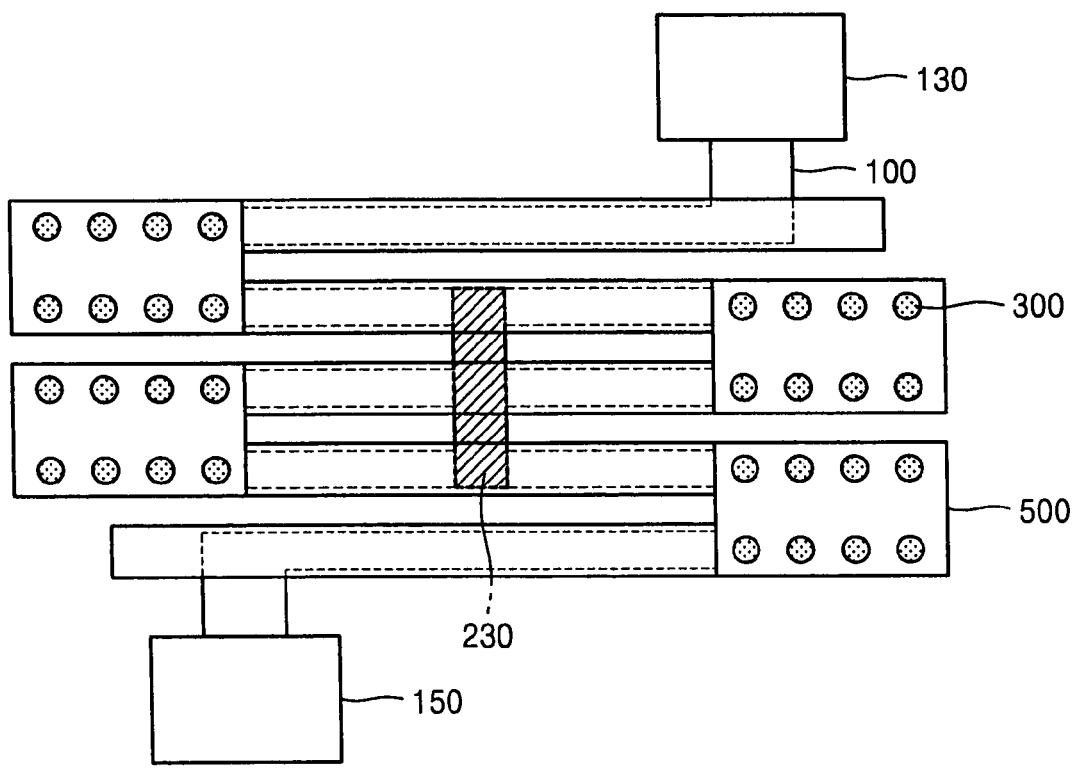

An equivalent circuit for the test structure of FIG. 1 is shown in FIG. 6, which also illustrates a test method implemented by this same structure. FIGS. 7 and 8 are drawings further illustrating the test method according to the present invention, in which, preferably, a difference in resistance caused by a metal failure is determined using the test structure of FIG. 1.

The equivalent circuit in FIG. 6 includes "N" metal patterns 110 forming first test pattern 100. Referring to FIG. 6, if a test voltage is applied to input pad 130, respective electrical currents flow from input pad 130 to output pad 150 via respective resistance paths $R_H$ (high) and $R_L$ (low), where $R_H$ is the resistance of the second test pattern 500 and $R_L$ is the resistance of the combination of metal vias 300 and the metal patterns 110 forming the first test pattern 100.

The $R_L$ resistance can be defined in the following equation;

$$R_L = (2R_{VIA} + R_{MP}) \quad (1)$$

where $R_{VIA}$ is the resistance of metal vias 300 and $R_{MP}$ is the resistance of metal patterns 110.

In a case where no metal failure is present, the test voltage as applied to input pad 130 which induces the respective electrical current flows to output pad 150 via the high and low ($R_H$ and $R_L$) resistance path, will indicate a normal (or expected) resistance $R_{NOR}$. Normal resistance, $R_{NOR}$, is defined in the following equation;

$$R_{NOR} = N \times [(R_H + R_L)/(R_H R_L)] \quad (2)$$

where N indicates the number of metal patterns 110 forming first test pattern 100 $R_L$ is defined in equation 1 above, and $R_H$ is the resistance of the second test pattern 500.

However, where an open metal failure is present (see element 210 in FIG. 7) the electrical current will flow through nearby metal vias 300 and second test pattern 500, and an open resistance, $R_{OP}$, will be observed. In this case, $R_{OP}$ is defined in the following equation;

$$R_{OP} = \{(N-X) \times [(R_H + R_L)/(R_H R_L)]\} + XR_H \quad (3)$$

where X indicates the number of open metal patterns and N, $R_H$, and $R_L$ are the same as with equation 2 above.

Thus, if one metal pattern is open out of the five metal patterns shown in the working example, open resistance $R_{OP}$ is defined in the following equation.

$$R_{OP} = \{4 \times [(R_H + R_L)/(R_H R_L)]\} + R_H \quad (4)$$

In an analogous vein, where two or more of the metal patterns 110 forming first test pattern 100 are shorted together, a short resistance $R_{SH}$ will be observed, where $R_{SH}$ is defined in the following equation.

$$R_{SH} = \{(N-X) \times [(R_H + R_L)/(R_H R_L)]\} + R_{MP} \quad (5)$$

In equation 5, X indicates the number of shorted metal patterns and N, $R_H$, and $R_L$ are same as with the above equations.

So, for example, if three of five metal patterns are shorted together (see element 230 in FIG. 8), a short resistance $R_{SH}$ will be defined in the following equation.

$$R_{SH} = \{2 \times [(R_H + R_L)/(R_H R_L)]\} + R_{MP} \quad (6)$$

As a result, the test structure for the semiconductor device according to the present invention can detect metal failures by comparing a normal (or expected) resistance with other resistances arising from open or shorted metal patterns. Furthermore, the test structure for the semiconductor device according to the present invention is able to detect the nature (open or short) and/or the size (number of affected metal patterns) of the metal failure by detecting, comparing, and analyzing the difference between a normal resistance and the detected resistance.

Accordingly, the test structure for the semiconductor device and its associated method of use are able to detect a metal failure without the use of conventional optical test equipment. Moreover, the test structure and associated method are able to detect the nature and/or size of a metal defect by analyzing the difference between a normal resistance and a resistance arising as the result of one or more open or short connections.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A test structure for a semiconductor device, the test structure comprising:
   a first test pattern including a plurality of electrically separated metal patterns;
   a plurality of metal vias formed proximate first and second end portions of each one of the plurality of metal patterns forming the first test pattern; and
   a second test pattern electrically connected in parallel to the first test pattern by the plurality of metal vias,
   such that a test voltage applied to the first test pattern indicates a resistance that varies in accordance with the presence and nature of a metal failure;
   wherein the second test pattern comprises an element selected from a group consisting of tungsten, aluminum, copper, or an alloy of these materials.

2. The test structure of claim 1, wherein the metal patterns forming the first test pattern comprise an input pad receiving the test voltage and an output pad discharging the applied test voltage.

3. The test structure of claim 1, wherein the metal patterns forming the first test pattern are comprised of one selected from the group consisting of aluminum, copper, or an alloy of these materials.

4. The test structure of claim 1, wherein the metal vias are formed from at least one of tungsten and copper.

5. A method of testing a semiconductor device using a test structure, wherein the test structure comprises;
   a first test pattern including a plurality of electrically separated metal patterns;
   a plurality of metal vias formed proximate first and second end portions of each one of the plurality of metal patterns forming the first test pattern; and
   a second test pattern electrically connected in parallel to the first test pattern by the plurality of metal vias,
   method comprising:
   applying a test voltage to the first test pattern; and,
   detecting the presence of a metal failure in relation to a resistance indicated upon application of the test voltage;
   wherein the second test pattern comprises an element selected from a group consisting of tungsten, aluminum, copper, or an alloy of these materials.

6. The test method of claim 5, wherein the test structure further comprises an input pad connected to one side of the first test pattern and receiving the test voltage, and an output pad connected to an opposite side of the first test pattern and discharging the test voltage, such that an electrical current flows from the input pad to the output pad through a combination of the first test pattern, the metal vias, and the second test pattern.

7. The test method of claim 6, wherein the nature of the metal failure is additionally indicated by the resistance arising from application of the test voltage to the input pad.

8. The test method of claim 5, wherein the nature of the metal failure comprises either a short or an open connection.

9. The test method of claim 8, wherein a number of either shorted or open connections is indicated by the resistance arising from application of the test voltage to the input pad.

10. The test method of claim 5, wherein a normal resistance $R_{NOR}$ indicates the absence of a metal failure, $R_{NOR}$ being defined by $\{N \times [(R_H + R_L)/(R_H R_L)]\}$, where N is the number of metal patterns, $R_H$ is the resistance of the second test pattern, and $R_L$ is equal to $[2R_{VIA} + R_{MP}]$, where $R_{VIA}$ is the resistance of the metal vias, and $R_{MP}$ is the resistance of a respective one of the metal patterns.

11. The test method claim 5, wherein an open resistance $R_{OP}$ indicates the presence of one or more open connections, $R_{OP}$ being defined by $\{(N-X) \times [(R_H + R_L)/(R_H R_L)] + XR_H\}$, where N is the number of metal patterns, X is the number of open metal patterns, $R_H$ is the resistance of the second test pattern, and $R_L$ is equal to $[2R_{VIA} + R_{MP}]$, where $R_{VIA}$ is the resistance of the metal vias, and $R_{MP}$ is the resistance of a respective one of the metal patterns.

12. The test method of claim 5, wherein a short resistance $R_{SH}$ indicates the presence of one or more shorted connections, $R_{SH}$ being defined by $\{(N-X) \times [(R_H + R_L)/(R_H R_L)] + R_{MP}\}$, where N is the number of metal patterns, X is the number of shorted metal patterns, $R_H$ is the resistance of the second test pattern, and $R_L$ is equal to $[2R_{VIA} + R_{MP}]$, where $R_{VIA}$ is the resistance of the metal vias, and $R_{MP}$ is the resistance of a respective one of the metal patterns.

13. The test method of claim 5, wherein the metal patterns forming the first test pattern are made of one selected from the group consisting of aluminum copper, or an alloy of these materials.

14. The test method claim 5, wherein the metal vias are formed from at least one of tungsten and copper.

* * * * *